United States Patent
Cho et al.

(10) Patent No.: US 10,847,750 B2
(45) Date of Patent: Nov. 24, 2020

(54) BENDABLE DISPLAY APPARATUS UTILIZING AN ORGANIC LAYER

(71) Applicant: SAMSUNG DISPLAY CO., LTD., Yongin-si (KR)

(72) Inventors: Yoonhyeung Cho, Yongin-si (KR); Eungseok Park, Yongin-si (KR); Wonmin Yun, Yongin-si (KR); Byoungduk Lee, Yongin-si (KR); Yunah Chung, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/849,405

(22) Filed: Sep. 9, 2015

(65) Prior Publication Data
US 2016/0240817 A1 Aug. 18, 2016

(30) Foreign Application Priority Data
Feb. 16, 2015 (KR) ........................ 10-2015-0023149

(51) Int. Cl.
*H01L 51/52* (2006.01)
(52) U.S. Cl.
CPC .. *H01L 51/5256* (2013.01); *H01L 2251/5338* (2013.01)
(58) Field of Classification Search
CPC ..................................................... H01L 51/52
USPC ..................... 257/40, 59; 345/173
See application file for complete search history.

(56) References Cited

U.S. PATENT DOCUMENTS

| 6,790,526 B2* | 9/2004 | Vargo et al. ............... 428/343 |
| 7,067,976 B2 | 6/2006 | Yamazaki |
| 7,129,102 B2* | 10/2006 | Yamazaki ................... 438/22 |
| 9,065,076 B2 | 6/2015 | Lee et al. |
| 9,525,012 B2 | 12/2016 | Lim et al. |
| 9,637,665 B2 | 5/2017 | Shim |
| 9,651,998 B2 | 5/2017 | Matsueda |
| 9,670,713 B2 | 6/2017 | Veerasamy |
| 9,719,665 B2 | 8/2017 | Hirakata et al. |

(Continued)

FOREIGN PATENT DOCUMENTS

| CN | 1395323 A | 2/2003 |
| CN | 102201547 A | 9/2011 |

(Continued)

OTHER PUBLICATIONS

Machine translation, Ueda, Japanese Pat. Pub. No. JP 2001-255514, translation date: Nov. 10, 2016, Espacenet, all pages.

(Continued)

*Primary Examiner* — Sheng-Bai Zhu
(74) *Attorney, Agent, or Firm* — Lewis Roca Rothgerber Christie LLP

(57) ABSTRACT

A display apparatus includes a substrate, a display layer on the substrate and including a plurality of display devices, and an encapsulation layer on the substrate and including a first inorganic layer, a second inorganic layer, and an organic layer between the first inorganic layer and the second inorganic layer, wherein the organic layer includes a first organic layer patterned to have a plurality of islands and a second organic layer filling gaps between the plurality of islands.

15 Claims, 9 Drawing Sheets

(56) References Cited

U.S. PATENT DOCUMENTS

| | | |
|---|---|---|
| 9,859,526 B2 | 1/2018 | Lee et al. |
| 2003/0027369 A1 | 2/2003 | Yamazaki |
| 2004/0234813 A1 | 11/2004 | Lee et al. |
| 2006/0214008 A1* | 9/2006 | Asami et al. ................ 235/492 |
| 2008/0055831 A1* | 3/2008 | Satoh ............... G02F 1/133305 361/600 |
| 2008/0180022 A1 | 7/2008 | Kwack et al. |
| 2009/0135550 A1 | 5/2009 | Umemoto et al. |
| 2010/0308335 A1* | 12/2010 | Kim et al. ...................... 257/59 |
| 2011/0134144 A1 | 6/2011 | Moriwaki |
| 2011/0234477 A1* | 9/2011 | Sano .................. H01L 51/0097 345/77 |
| 2012/0147599 A1 | 6/2012 | Shim et al. |
| 2012/0154707 A1 | 6/2012 | Hsieh et al. |
| 2013/0221840 A1 | 8/2013 | Oh |
| 2013/0334959 A1* | 12/2013 | Wang ................. H01L 51/5256 313/512 |
| 2014/0065326 A1* | 3/2014 | Lee ........................... G06F 1/16 428/12 |
| 2014/0131668 A1 | 5/2014 | Kim |
| 2014/0131682 A1* | 5/2014 | Kim et al. ..................... 257/40 |
| 2014/0240985 A1 | 8/2014 | Kim et al. |
| 2014/0295150 A1* | 10/2014 | Bower ...................... C09J 7/02 428/201 |
| 2014/0300529 A1 | 10/2014 | Kim et al. |
| 2015/0001483 A1 | 1/2015 | Namkung et al. |
| 2015/0137102 A1* | 5/2015 | Yang .................... B32B 37/144 257/40 |
| 2015/0144921 A1* | 5/2015 | Lim et al. ...................... 257/40 |
| 2015/0179717 A1 | 6/2015 | Kawata |
| 2015/0185782 A1* | 7/2015 | Kim ..................... G06F 1/1652 349/12 |
| 2015/0382446 A1* | 12/2015 | Kwon ................... H05K 1/028 174/251 |
| 2016/0007441 A1 | 1/2016 | Matsueda |
| 2016/0240817 A1 | 8/2016 | Cho et al. |
| 2017/0141348 A1 | 5/2017 | Yu |

FOREIGN PATENT DOCUMENTS

| | | |
|---|---|---|
| CN | 102664239 A | 9/2012 |
| CN | 104103776 A | 10/2014 |
| CN | 105870149 A | 8/2016 |
| JP | 2001-255514 A | 9/2001 |
| KR | 2003-0004128 A | 1/2003 |
| KR | 10-2004-0099800 A | 12/2004 |
| KR | 10-2010-0130898 A | 12/2010 |
| KR | 10-2012-0063748 A | 6/2012 |
| KR | 10-2014-0060776 A | 5/2014 |
| KR | 10-2014-0101977 A | 8/2014 |

OTHER PUBLICATIONS

EPO Search Report dated Jun. 27, 2016 for corresponding European Patent application 16155343.3 (7 pages).

U.S. Office Action dated Nov. 18, 2016, issued in cross-reference U.S. Appl. No. 14/945,333 (23 pages).

U.S. Office Action dated May 26, 2017, issued in cross-reference U.S. Appl. No. 14/945,333 (12 pages).

U.S. Notice of Allowance dated Aug. 23, 2017, issued in cross-reference U.S. Appl. No. 14/945,333 (12 pages).

"How to Use the Modern Plastics Encyclopedia," Modern Plastics Encyclopedia, 1988, 5 pages.

Prabhakumar, A., et at., "Comparison of the Adhesion Strength of Epoxy and Silicone Based Thermal Interface Materials," Electronic Components and Technology Conference, 2003, pp. 1809-1814.

* cited by examiner

BENDABLE DISPLAY APPARATUS UTILIZING AN ORGANIC LAYER

CROSS-REFERENCE TO RELATED APPLICATION

This application claims priority to and the benefit of Korean Patent Application No. 10-2015-0023149, filed on Feb. 16, 2015, in the Korean Intellectual Property Office, the disclosure of which is incorporated herein in its entirety by reference.

BACKGROUND

1. Field

Aspects of one or more exemplary embodiments relate to a display apparatus.

2. Description of the Related Art

In general, a display apparatus may provide various suitable types of information such as images or moving images, information about a state or operations of an electronic device, a user interface used to easily manipulate an electronic device, or the like. Recently, flexible display apparatuses have been developed, and thus, attempts have been made to improve mobility and user convenience with respect to the display apparatuses.

However, when a display apparatus according to the related art is bent due to its flexibility, the display apparatus may not be properly bent, or exfoliation between components may occur.

SUMMARY

Aspects of one or more exemplary embodiments are directed to a display apparatus that is flexible and/or capable of reducing or preventing the occurrence of bending defects (in order to solve problems including the above-described problems).

Additional aspects will be set forth in part in the description which follows and, in part, will be apparent from the description, or may be learned by practice of the presented embodiments.

According to one or more exemplary embodiments, there is provided a display apparatus including: a substrate; a display layer on the substrate and including a plurality of display devices; and an encapsulation layer on the substrate and including a first inorganic layer, a second inorganic layer, and an organic layer between the first inorganic layer and the second inorganic layer, wherein the organic layer includes a first organic layer patterned to have a plurality of islands and a second organic layer filling gaps between the plurality of islands.

In an embodiment, the substrate includes a bending area, and the first organic layer is positioned to correspond to the bending area.

In an embodiment, the organic layer includes any one of a material included in the first organic layer and a material included in the second organic layer, and is not patterned in areas other than the bending area.

In an embodiment, the encapsulation layer further includes a boundary layer between the first organic layer and the second organic layer, the boundary layer including a first material included in the first organic layer and a second material included in the second organic layer.

In an embodiment, each of the plurality of islands has a long axis and a short axis and extends along a first direction.

In an embodiment, a surface of the substrate has a short axis along the first direction and a long axis along a second direction, which crosses the first direction, and has a rectangular shape.

In an embodiment, the first organic layer has a first modulus, and a second organic layer has a second modulus different from the first modulus, and an area of a lower surface of one of the first and second organic layers having a greater modulus, is greater than a corresponding area of an upper surface of the one of the first and second organic layers, wherein the lower surface faces the display layer.

In an embodiment, the one of the first and second organic layers having the greater modulus includes acryl and/or epoxy, and an other one of the first and second organic layers having a smaller modulus, includes silicon and/or fluorine.

In an embodiment, the first organic layer has a first modulus, and the second organic layer has a second modulus smaller than the first modulus.

In an embodiment, the first organic layer includes acryl and/or epoxy, and the second organic layer includes silicon and/or fluorine.

In an embodiment, the substrate includes a bending area, the first organic layer patterned to have the plurality of islands is positioned to correspond to the bending area, and the organic layer includes a material included in the first organic layer and is not patterned in areas other than the bending area of the substrate.

In an embodiment, the first organic layer has a first modulus, and the second organic layer has a second modulus greater than the first modulus.

In an embodiment, the substrate includes a bending area, the first organic layer patterned to have the plurality of islands is positioned to correspond to the bending area, and the organic layer includes a material included in the second organic layer and is not patterned in remaining areas other than the bending area of the substrate.

In an embodiment, the first organic layer includes acryl and/or epoxy, and the second organic layer includes silicon or fluorine.

In an embodiment, the organic layer includes a first portion having a first modulus, a second portion having a second modulus different from the first modulus, and a third portion having a third modulus between the first modulus and the second modulus.

In an embodiment, the organic layer includes a first portion having a first modulus, a second portion having a second modulus different from the first modulus, and a third portion between the first portion and the second portion, wherein the third portion has a modulus that gradually increases or decreases from a location close to the first portion to a location close to the second portion.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
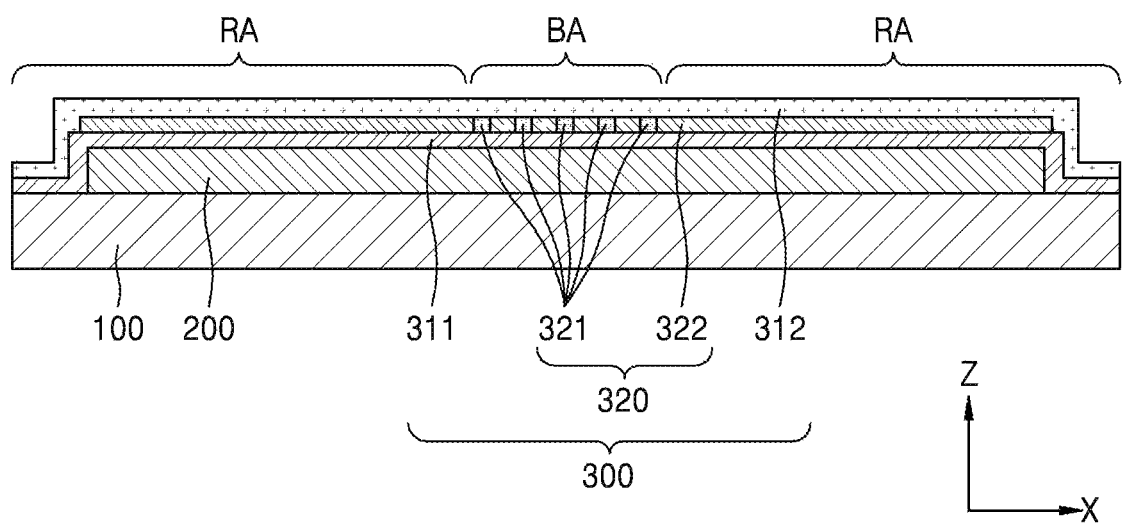
FIG. 1 is a schematic cross-sectional view of a display apparatus according to an exemplary embodiment.

The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art.

Hereinafter, the present invention will be described in detail by explaining exemplary embodiments of the inventive concept with reference to the attached drawings. Like reference numerals in the drawings denote like elements, and their descriptions may not be provided.

Sizes of components in the drawings may be exaggerated for convenience of explanation. In other words, because sizes and thicknesses of components in the drawings are arbitrarily illustrated for convenience of explanation, the following exemplary embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic cross-sectional view of a display apparatus according to an exemplary embodiment. The display apparatus includes a substrate 100, a display layer 200, and an encapsulation layer 300.

The substrate 100 has flexibility or bendability and may include, for example, a material such as polyimide (PI), polyethyleneterephthalate (PET), and/or the like. However, a material of the substrate 100 included in the display apparatus is not limited thereto and may vary.

The display layer 200 is disposed above the substrate 100 and may include a plurality of display devices. The display devices may be liquid crystal devices or organic light-emitting devices. The display layer 200 may include thin film transistors (TFTs) that are electrically connected to the display devices. In FIG. 1, an upper surface of the display layer 200 (+Z direction) is flat for convenience of explanation. However, the upper surface of the display layer 200 may be flat or curved. In the former case, a planarization layer for flattening the upper surface of the display layer 200 may be further included as desired.

The encapsulation layer 300 may have a multilayer structure. In further detail, the encapsulation layer 300 may include a first inorganic layer 311, a second inorganic layer 312, and an organic layer 320. In this case, the organic layer 320 may be disposed between the first inorganic layer 311 and the second inorganic layer 312. The encapsulation layer 300, in which an organic layer and inorganic layers are stacked, may prevent or substantially prevent oxygen or moisture from penetrating the display layer 200 from the outside or may prevent or reduce (e.g., minimize) deterioration of the display layer 200. In particular, when the display layer 200 includes organic light-emitting devices, because the organic light-emitting devices are easily deteriorated by moisture, oxygen, and/or the like, it is desirable to form the encapsulation layer 300.

Because the encapsulation layer 300 includes the first inorganic layer 311, the second inorganic layer 312, and the organic layer 320, even if cracks appear in the encapsulation layer 300 having the multilayer structure, cracks may not appear in an area between the first inorganic layer 311 and the organic layer 320 or an area between the organic layer 320 and the second inorganic layer 312. Thus, formation of a path via which oxygen, moisture, and/or the like penetrates the display layer 200 from the outside may be prevented or reduced (e.g., minimized). The first inorganic layer 311 and/or the second inorganic layer 312 of the above-described encapsulation layer 300 may include silicon oxide, silicon nitride, and/or the like.

In this case, the organic layer 320 includes a first organic layer 321 and a second organic layer 322, as illustrated in FIG. 1. The first organic layer 321 is patterned to have a plurality of islands (e.g., a plurality of isolated/unconnected regions), and the second organic layer 322 fills respective gaps between the islands of the first organic layer 321. In further detail, as illustrated in FIG. 1, when the substrate 100 includes a bending area BA and remaining areas RA, the first organic layer 321, which is patterned to have islands, may be arranged to correspond to the bending area BA. The second organic layer 322 fills the gaps between the islands of the first organic layer 321 and may correspond to the remaining areas RA of the substrate 100, as illustrated in FIG. 1.

When the first organic layer 321 and the second organic layer 322 are formed of materials having different properties, characteristics of the display apparatus may be greatly improved.

Figure 2:
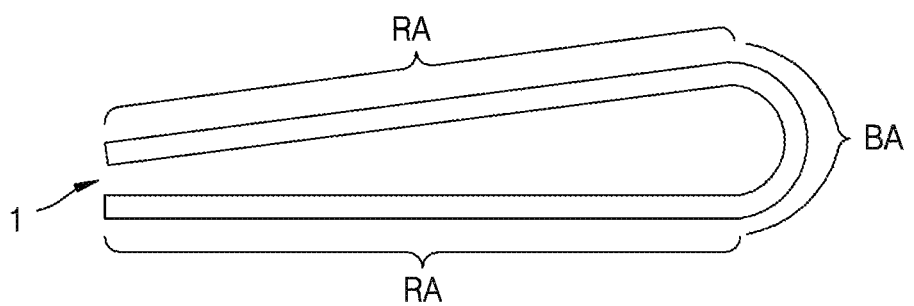
FIG. 2 is a schematic conceptual view of the display apparatus of FIG. 1 that is bent.

For example, when the first organic layer 321 has a first modulus and the second organic layer 322 has a second modulus that is greater than the first modulus, bendability and restorability of the display apparatus may be greatly improved in the bending area BA corresponding to the first organic layer 321 that is patterned to have a plurality of islands and has a relatively small modulus. Accordingly, as illustrated in FIG. 2, when the display apparatus 1 is bent in the bending area BA, and when external power applied to bend the display apparatus 1 is no longer applied, the display apparatus 1 may be restored to be, for example, flat, as illustrated in FIG. 1. Here, the modulus may refer to an elastic modulus, a tensile modulus, or a Young's modulus.

In addition, when the organic layer 320 only has the first organic layer 321 that has a relatively small modulus in the bending area BA, exfoliation may occur in a portion of the bending area BA between the organic layer 320 and the first inorganic layer 311 or a portion of the bending area BA between the organic layer 320 and the second inorganic layer 312. However, in the display apparatus according to the present exemplary embodiment, because the second organic layer 322 having a relatively large modulus fills the gaps between the islands of the first organic layer 321 in the bending area BA, the exfoliation may be reduced (e.g., minimized) or prevented in the bending area BA. The possibility of the exfoliation occurring may be greatly decreased, because the second organic layer 322 having the relatively large modulus is not patterned in the remaining areas RA.

The first organic layer 321 having the relatively small modulus may include silicon, fluorine, and/or the like, and the second organic layer 322 having the relatively large modulus may include acryl, epoxy, and/or the like.

Figure 3:
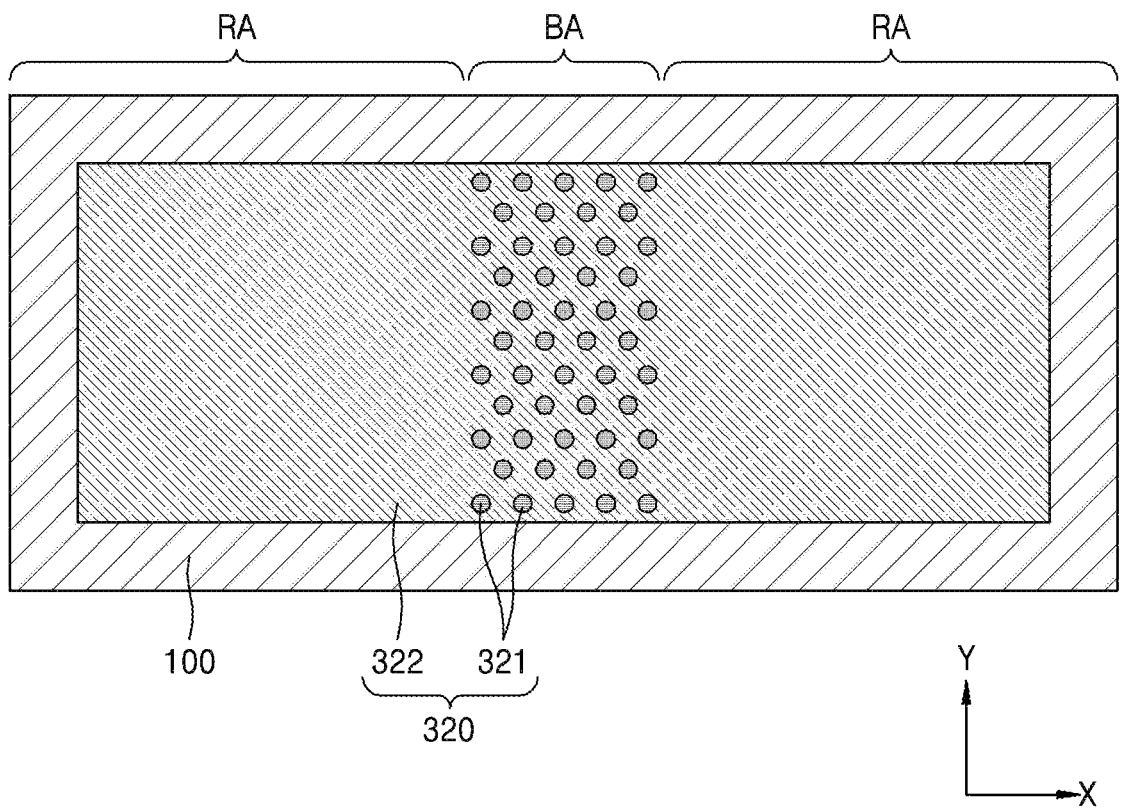
FIG. 3 is a schematic plan view of a portion of the display apparatus of FIG. 1.

FIG. 3 is a schematic plan view of a portion of the display apparatus of FIG. 1, and the display layer 200, the first inorganic layer 311, and the second inorganic layer 312 are not illustrated for convenience of explanation. As illustrated in FIG. 3, each of the patterned islands (e.g., patterned isolated regions) of the first organic layer 321 may have a circular or oval shape in the bending area BA. Each of the patterned islands of the first organic layer 321 may have, for example, a polygonal shape in the plan view.

A method of forming the organic layer 320 including the first organic layer 321 and the second organic layer 322 may include: discretely dotting, on the first inorganic layer 311, droplets of monomers used to form the first organic layer 321 in the bending area BA through, for example, an inkjet printing method; hardening the dotted droplets by ultraviolet (UV) rays; arranging monomers, which are used to form the second organic layer 322, to fill respective gaps between the islands of the first organic layer 321 and to cover the first inorganic layer 311 in the remaining areas RA through an inkjet printing method, a spin coating method, and/or a slit coating method; and hardening the arranged monomers by UV rays. Alternatively, the droplets of the monomers used to form the first organic layer 321 are discretely dotted on the first inorganic layer 311 in the bending area BA through the inkjet printing method, droplets of the monomers used to form the second organic layer 322 are dotted between the islands of the first organic layer 321 and the remaining areas RA, and then the monomers used to form the first organic layer 321 and the monomers used to form the second organic layer 322 may be concurrently (e.g., simultaneously) hardened by UV rays.

Figure 4:
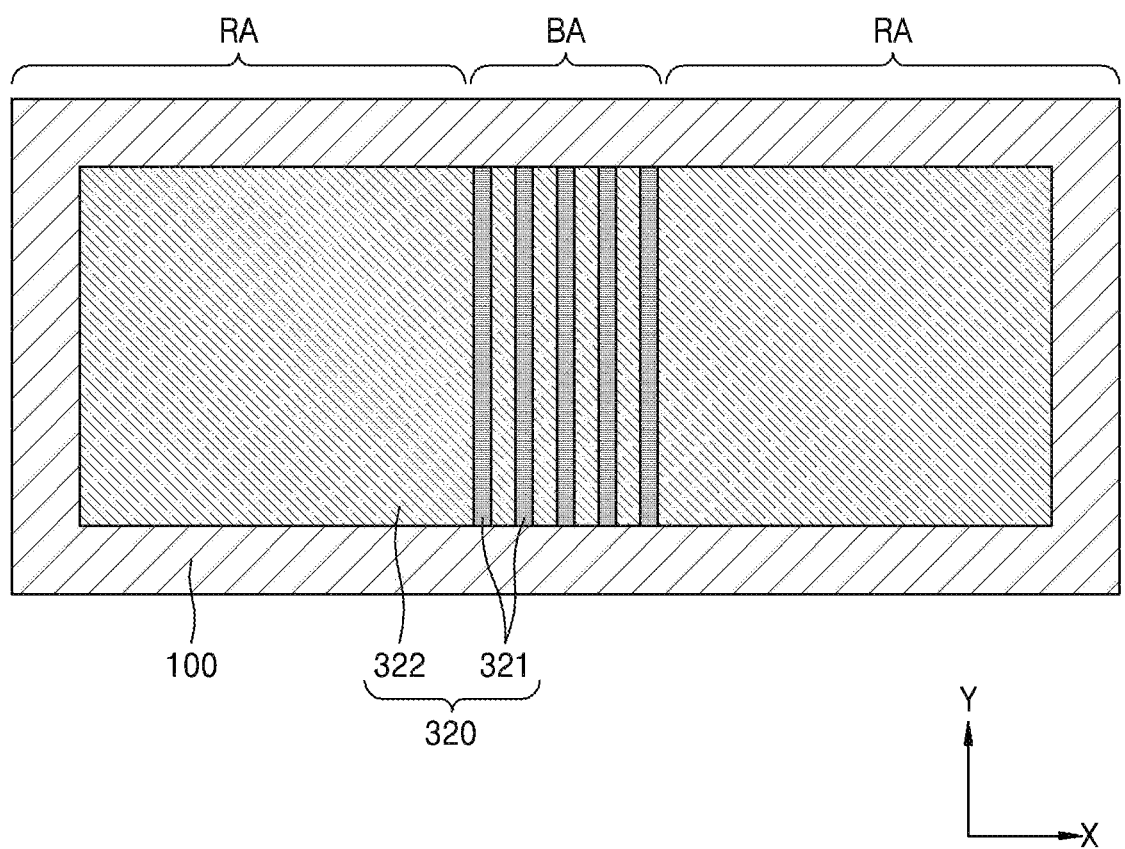
FIG. 4 is a schematic plan view of a portion of a display apparatus according to another exemplary embodiment.

FIG. 3 illustrates that each of the patterned islands of the first organic layer 321 has, for example, a circular or oval shape in the bending area BA, but the inventive concept is not limited thereto. For example, as illustrated in FIG. 4, which is a schematic plan view of a portion of a display apparatus according to another exemplary embodiment of the inventive concept, each of the patterned islands of the first organic layer 321 has a long axis (e.g., the Y-axis direction) and a short axis (e.g., the X-axis direction) and may extend in one direction (e.g., the Y-axis direction). In this case, the second organic layer 322 that fills the gaps between the islands of the first organic layer 321 may also extend in one direction (e.g., the Y-axis direction) in the bending area BA. As illustrated in FIG. 4, the second organic layer 322 may correspond (in shape) to the remaining areas RA of the substrate 100 without being patterned.

In this case, a surface of the substrate 100 has a short axis in one direction (e.g., the Y-axis direction) and a long axis in the other direction (e.g., the X-axis direction), which crosses the one direction, and thus may have a rectangular shape. The rectangular shape of the surface of the substrate 100 may refer to the display apparatus having a rectangular shape based on the plan view thereof. In this case, when the display apparatus has bendability, the bending area BA has a long axis in one direction (e.g., the Y-axis direction) and a short axis in the other direction (e.g., the X-axis direction), which crosses the one direction, and has a rectangular shape, as illustrated in FIG. 4. The display apparatus is bent when both ends of the substrate 100 of the display apparatus move in the +Z or −Z direction, wherein both ends extend in the other direction (e.g., the X-axis direction).

Therefore, as illustrated in FIG. 4, each of the islands of the first organic layer 321 has a long axis (e.g., the Y-axis direction) and a short axis (e.g., the X-axis direction) and extends in one direction (e.g., the Y-axis direction), and the second organic layer 322 may also extend in the one direction (e.g., the Y-axis direction) in the bending area BA, thereby greatly improving the bendability and restorability in the bending area BA. Also, in the bending area BA, the exfoliation may be prevented or reduced (e.g., minimized) in an area between the organic layer 320 and the first inorganic layer 311 or an area between the organic layer 320 and the second inorganic layer 312.

A method of forming the organic layer 320 including the first organic layer 321 and the second organic layer 322 may include: continuously dotting, on the first inorganic layer 311, droplets of the monomers used to form the first organic layer 321 in the Y-axis direction in the bending area BA through, for example, an inkjet printing method; forming a first organic layer 321 having a plurality of linear islands (e.g., a plurality of isolated linear regions) by hardening the droplets after the continuous dotting has been repeatedly performed; arranging monomers used to form the second organic layer 322 to fill respective gaps between the linear islands of the first organic layer 321 and to cover the first inorganic layer 311 in the remaining areas RA through an inkjet printing method, a spin coating method, and/or a slit coating method; and hardening the arranged monomers.

Alternatively, by using a plurality of inkjet printing heads, the droplets of the monomers used to form the first organic layer 321 and droplets of the monomers used to form the second organic layer 322 are continuously dotted in the Y-axis direction on the first inorganic layer 311 in the bending area BA, and then the dotting is repeated multiple times, as may be desired. Then, the droplets of the monomers used to form the first organic layer 321 and droplets of the monomers used to form the second organic layer 322 are hardened, and a pattern of the first organic layer 321 (which has a linear island form) and the second organic layer 322 are alternately arranged in the bending area BA may be formed.

Figure 5:
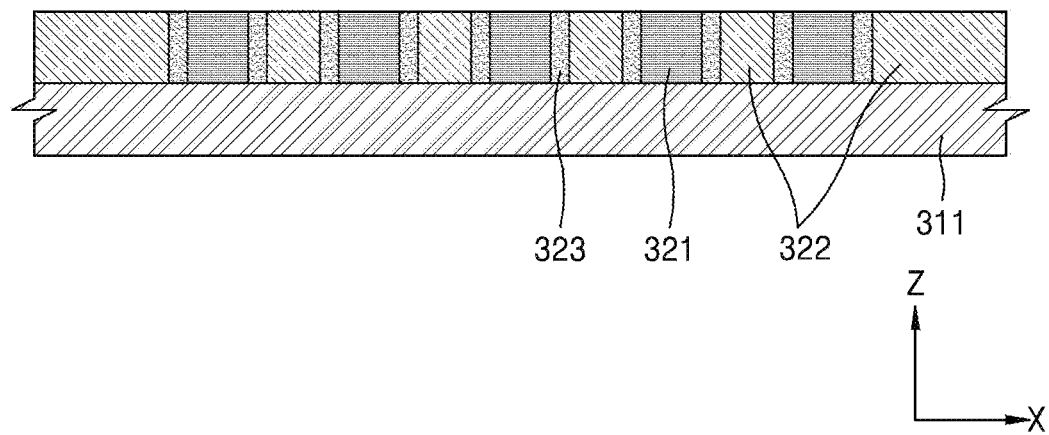
FIG. 5 is a schematic plan view of a portion of a display apparatus according to another exemplary embodiment.

In this case, before the monomers used to form the first organic layer 321 and the monomers used to form the second organic layer 322 are hardened, the monomers used to form the first organic layer 321 and the monomers used to form the second organic layer 322 may be partially mixed or may react to each other. Thus, as illustrated in FIG. 5, which is a schematic cross-sectional view of a portion of a display apparatus according to another exemplary embodiment, the encapsulation layer 300 may further include a boundary layer 323 disposed between the first organic layer 321 and the second organic layer 322. The boundary layer 323 may include a first material included in the first organic layer 321 and a second material included in the second organic layer 322. For reference, as described above, the first organic layer 321 having the relatively small modulus may include silicon, fluorine, and/or the like, and the second organic layer 322 having the relatively large modulus may include acryl, epoxy, and/or the like.

The first organic layer 321, which is patterned to have the islands and has the relatively small modulus, and the second organic layer 322, which fills the gaps between the islands of the first organic layer 321 in the bending area BA and has the relatively large modulus, have been described, but the inventive concept is not limited thereto.

Figure 6:
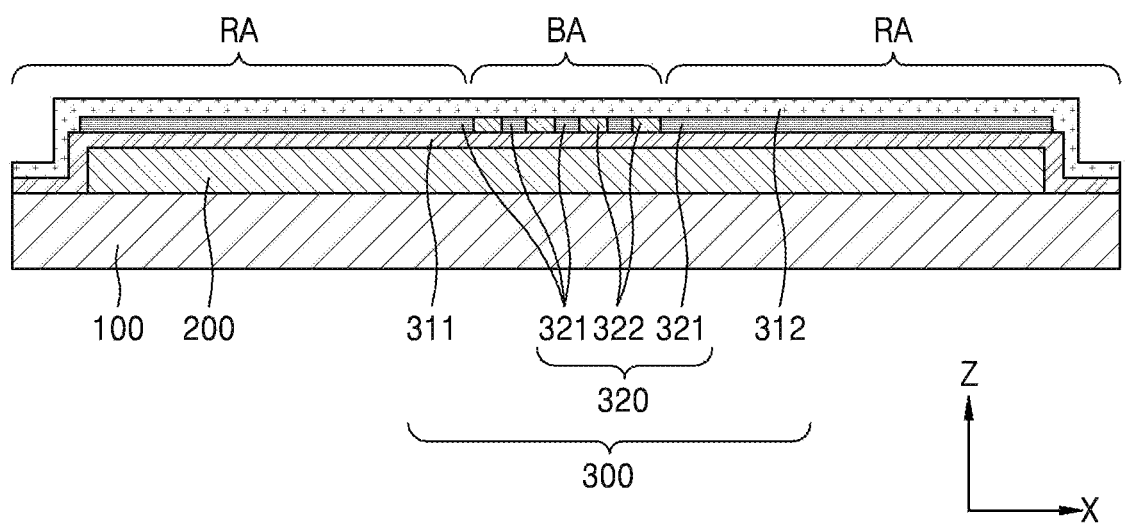
FIG. 6 is a schematic cross-sectional view of a display apparatus according to another exemplary embodiment.

For example, as illustrated, FIG. 6 is a schematic cross-sectional view of a display apparatus according to another exemplary embodiment, the first organic layer 321, which is patterned to have the islands in the bending area BA, may have a relatively large modulus, and the second organic layer 322, which fills the gaps between the islands of the first organic layer 321 in the bending area BA, may have a relatively small modulus. In this case, the first organic layer 321 having the relatively large modulus may not be patterned in the remaining areas RA.

Figure 7:
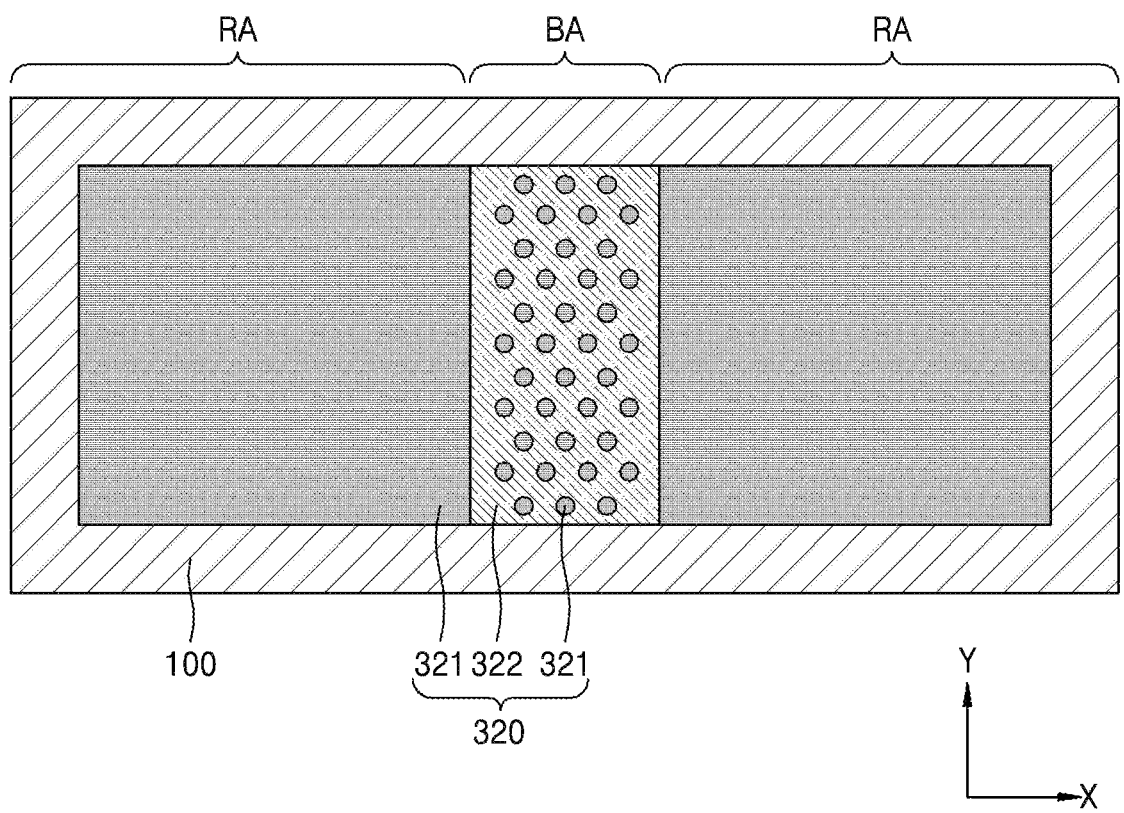
FIG. 7 is a schematic plan view of a portion of the display apparatus of FIG. 6.

FIG. 7 is a schematic plan view of a portion of the display apparatus of FIG. 6. As illustrated in FIG. 7, each of the islands of the first organic layer 321 may have a circular, oval, or polygonal shape in the bending area BA. The first organic layer 321 may not be patterned in the remaining areas RA.

A method of forming the organic layer 320 including the first organic layer 321 and the second organic layer 322 may include: discretely dotting, on the first inorganic layer 311, droplets of monomers used to form the first organic layer 321 in the bending area BA through, for example, an inkjet printing method; hardening the dotted droplets by UV rays; arranging monomers, which are used to form the second organic layer 322, to fill respective gaps between the islands of the first organic layer 321 through an inkjet printing method, a spin coating method, and/or a slit coating method; and hardening the arranged monomers by UV rays. Before the second organic layer 322 is formed, the monomers used to form the first organic layer 321 are arranged on the first inorganic layer 311 in the remaining areas RA through an inkjet printing method, a slit coating method and/or the like and then hardened by the UV rays.

Figure 8:
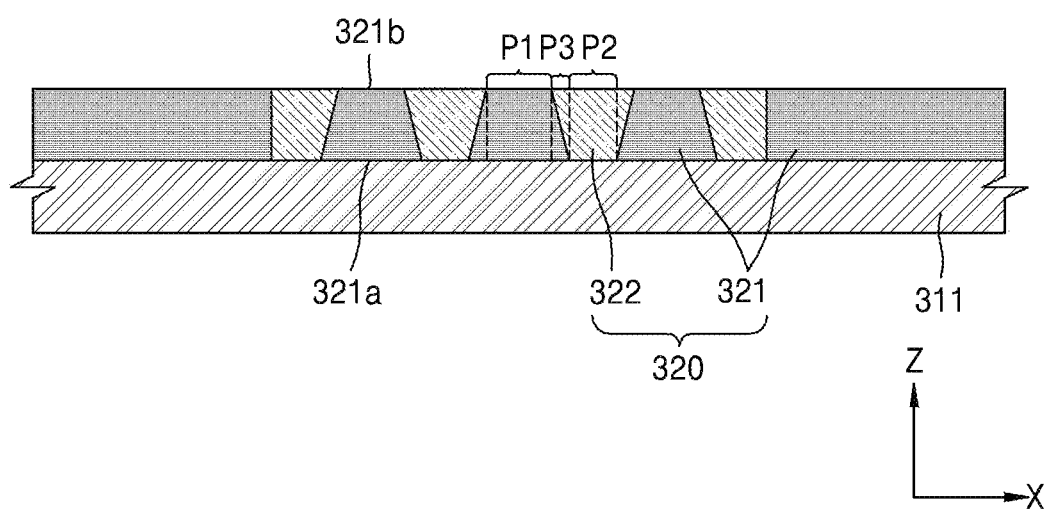
FIG. 8 is a schematic cross-sectional view of a portion of the display apparatus of FIG. 6.

FIG. 8 is a schematic cross-sectional view of a portion of the display apparatus of FIG. 6 in which the organic layer 320 is formed. When the droplets of the monomers used to form the first organic layer 321 are discretely dotted and hardened by UV rays on the first inorganic layer 311 in the bending area BA, each island of the first organic layer 321 may have a lower surface 321a that has a greater area than an area of an upper surface 321b, wherein the lower surface 321a extends in a direction toward the display layer 200 because the monomers, which are in a liquid form, may flow downward before the monomers are hardened. When the monomers used to form the second organic layer 322 are arranged to fill the gaps between the islands of the first organic layer 321 through an inkjet printing method, a spin coating method, and/or a slit coating method and then are hardened by the UV rays after the monomers used to form the first organic layer 321 are hardened, a lower surface of the second organic layer 322 in a direction toward the display layer 200 may have a greater area then an upper surface thereof.

Unlike the illustration of FIG. 8, a cross-section of each island of the first organic layer 321 may have a convex shape, but the upper surface 321b and side surfaces thereof are not angled. That is, each island of the first organic layer 321 may have a shape similar to, for example, a convex lens. Although each island of the first organic layer 321 has a shape similar to a convex lens, the second organic layer 322 fills the gaps between the islands of the first organic layer 321 so that an entire portion of an upper surface of the organic layer 320 is flattened.

Both ends of the substrate 100 in the X-axis direction move in a −Z direction relative to the central portion of the substrate, and thus, the display apparatus of FIG. 6 may be convexly bent in a +Z direction from a state thereof shown in FIG. 6. When the display apparatus is convexly bent, a greatest amount of stress is applied to the upper surface of the organic layer 320 in the bending area BA. In further detail, the larger the modulus is, the greater the stress applied to the upper surface of the organic layer 320 is. The large amount of stress may result in a problem such as exfoliation between the upper surface of the organic layer 320 and the second inorganic layer 312.

However, in the display apparatus according to the present exemplary embodiment, the upper surface 321b of each island of the first organic layer 321 having the relatively large modulus has a smaller area than the lower surface 321a. Therefore, a stress applied to the upper surface of the organic layer 320 due to bending may be decreased.

Figure 9:
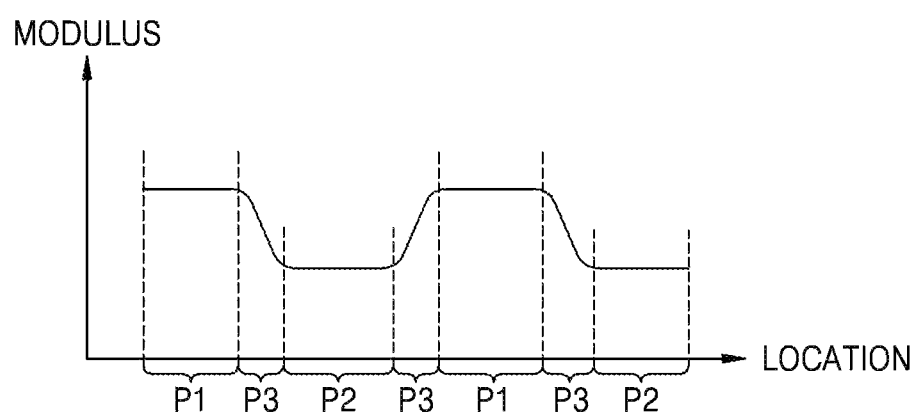
FIG. 9 is a graph for explaining a change in modulus according to a location on a portion of the display apparatus of FIG. 8.

In the case of the organic layer 320 of FIG. 8, a change in modulus according to a location of the organic layer 320 (a +X direction) in the bending area BA may be schematically illustrated as a graph of FIG. 9. That is, a first portion P1, which corresponds to the upper surface 321b of the first organic layer 321 having the relatively large modulus, has a large modulus, and a second portion P2, which corresponds to a lower surface of the second organic layer 322 having the relatively small modulus, has a small modulus. Because the first organic layer 321 having the relatively large modulus and the organic layer 322 having the relatively small modulus co-exist in a third portion P3 between the first portion P1 and the second portion P2, the third portion P3 has a modulus that is smaller than the modulus of the first portion P1 but greater than that of the second portion P2. In addition, because a volume of the first organic layer 321 having the relatively large modulus becomes greater than a volume of the second organic layer 322 having the relatively small modulus in a direction toward the first portion P1 in the third portion P3, the modulus of the third portion P3 gradually increases in a direction toward the first portion P1. Likewise, because a volume of the second organic layer 322 having the relatively small modulus becomes greater than a volume of the first organic layer 321 having the relatively large modulus in a direction toward the second portion P2 in the third portion P3, the modulus of the third portion P3 gradually decreases in a direction toward the second portion P2.

For reference, when the modulus of the first organic layer 321 is smaller than that of the second organic layer 322, the modulus of the third portion P3 may gradually decrease in a direction toward the first portion P1. The modulus of the third portion P3 may gradually increase in a direction toward the second portion P2.

As described with reference to FIG. 5, when the organic layer 320 includes the boundary layer 323 disposed between the first organic layer 321 and the second organic layer 322, other than the first organic layer 321 and the second organic layer 322, a change in modulus according to a location of the organic layer 320 (a +X direction) in the bending area BA may be schematically illustrated as a graph of FIG. 9. That is, as illustrated in FIG. 5, the second organic layer 322 has a large modulus, and the first organic layer 321 has a small modulus. The boundary layer 323 disposed between the first organic layer 321 and the second organic layer 322 is formed due to a mixture or reaction of a material forming the second organic layer 322 having the relatively great modulus and a material forming the first organic layer 321 having the relatively small modulus, and thus, a modulus of the boundary layer 323 may be smaller than that of the second organic layer 322 but greater than that of the first organic layer 321.

Because the boundary layer 323 is highly affected by the material forming the second organic layer 322 having the relatively great modulus in a direction toward the second organic layer 322, the modulus of the boundary layer 323 increases in a direction toward the second organic layer 322. Likewise, because boundary layer 323 is highly affected by the material forming the first organic layer 321 having the relatively small modulus in a direction toward the first organic layer 321, the modulus of the boundary layer 323 decreases in a direction toward the first organic layer 321.

As described above, the organic layer 320 of FIG. 8 may be formed by discretely dotting, on the first inorganic layer 311, the droplets of the monomers used to form the first organic layer 321 in the bending area, hardening the droplets by the UV rays, arranging the monomers used to form the second organic layer 322 to fill the gaps between the islands of the first organic layer 321 through an inkjet printing method, a spin coating method, and/or a slit coating method, and then hardening the monomers by the UV rays. Alternatively, the droplets of the monomers used to form the first organic layer 321 are discretely dotted on the first inorganic layer 311 in the bending area BA through the inkjet printing method and then are dotted in the remaining areas RA, droplets of the monomers used to form the second organic layer 322 are dotted between the gaps between the islands of the first organic layer 321, and then the monomers used to form the first organic layer 321 and the monomers used to form the second organic layer 322 may be concurrently (e.g., simultaneously) hardened by the UV rays. In this case, as described with reference to FIG. 5, the boundary layer 323 may be disposed between the first organic layer 321 and the second organic layer 322.

FIG. 7 illustrates that each island of the first organic layer 321 has a circular, oval, or polygonal shape in the bending area BA, but the inventive concept is not limited thereto. For example, similar to the illustration of FIG. 4, each island of the first organic layer 321 may have a linear shape extending in a Y-axis direction in the bending area BA. In this case, a cross-section of the organic layer 320 may be the same as or similar to the illustration of FIG. 8.

According to the above one or more exemplary embodiments of the inventive concept, one of the first organic layer 321 and the second organic layer 322, which has a greater modulus, includes acryl or epoxy, and the other one of the first organic layer 321 and the second organic layer 322, which has a smaller modulus, includes silicon or fluorine.

It has been described that the substrate 100 includes the bending area BA and the remaining areas RA and the first organic layer 321 is patterned to have the islands in the bending area BA, but the inventive concept is not limited thereto. For example, the first organic layer 321 may be patterned to have the islands in an entire portion of the organic layer 320, and the second organic layer 322 may fill respective gaps between the islands of the first organic layer 321. In this case, one of the first organic layer 321 and the second organic layer 322, which has a greater modulus, may be formed along a boundary of the organic layer 320. The one having the greater modulus is formed along the boundary of the organic layer 320 because oxygen, moisture, and/or the like may easily penetrate an outer portion of the encapsulation layer 300 from the outside, thereby improving an encapsulation effect of the encapsulation layer 300 including the organic layer 320. Also, because exfoliation may relatively easily occur between layers of the encapsulation layer 300, which correspond to the outer portion of the encapsulation layer 300, in comparison with layers of the encapsulation layer 300, which correspond to a central portion of the encapsulation layer 300, due to an external impact, the one having the greater modulus is formed along the boundary of the organic layer 320 so that a possibility that the exfoliation occurs between the layers of the encapsulation layer 300 may be decreased.

It has been described that the encapsulation layer 300 includes the first inorganic layer 311, the organic layer 320, and the second inorganic layer 312, but may have a multi-layer structure including a greater number of layers. For example, the encapsulation layer 300 may have a structure in which a great number of organic layers and inorganic layers are alternately arranged. In this case, at least one of the organic layers may have the above-described structure of the organic layer 320.

As described above, according to the one or more of the above exemplary embodiments, a display apparatus that is flexible and capable of preventing or substantially preventing the occurrence of bending defects may be implemented. However, the inventive concept is not limited thereto.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various suitable changes in form and details may be made therein without departing from the spirit and scope as defined by the following claims, and equivalents thereof.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept.

It will be understood that when a layer is referred to as being "between" two layers, it can be the only layer between the two layers, or one or more intervening layers may also be present.

As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the terms "use," "using," and "used" may be considered synonymous with the terms "utilize," "utilizing," and "utilized," respectively.

The display apparatus and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display apparatus may be formed on one integrated circuit (IC) chip or on separate IC chips. Further, the various components of the display apparatus may be implemented on a flexible printed circuit film, a tape carrier package (TCP), a printed circuit board (PCB), or formed on a same substrate. Further, the various components of the display apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

What is claimed is:

1. A display apparatus comprising:
   a substrate;
   a display layer on the substrate and comprising a plurality of display devices; and
   an encapsulation layer on the substrate and comprising a first inorganic layer, a second inorganic layer, and an organic layer between the first inorganic layer and the second inorganic layer,
   wherein the organic layer comprises a first organic layer patterned to have a plurality of islands and a second organic layer filling gaps between the plurality of islands,
   wherein the first organic layer has a first modulus, and a second organic layer has a second modulus different from the first modulus, and
   wherein an area of a lower surface of one of the first and second organic layers having a greater modulus is greater than a corresponding area of an upper surface of the one of the first and second organic layers when the display apparatus is unbent, wherein the lower surface faces the display layer.

2. The display apparatus of claim 1, wherein the substrate comprises a bending area, and
   wherein the first organic layer is positioned to correspond to the bending area.

3. The display apparatus of claim 2, wherein the organic layer comprises any one of a material comprised in the first organic layer and a material comprised in the second organic layer, and is not patterned in areas other than the bending area.

4. The display apparatus of claim 1, wherein the encapsulation layer further comprises a boundary layer between the first organic layer and the second organic layer, the boundary layer comprising a first material comprised in the first organic layer and a second material comprised in the second organic layer.

5. The display apparatus of claim 1, wherein each of the plurality of islands has a long axis and a short axis, and extends along a first direction.

6. The display apparatus of claim 5, wherein a surface of the substrate has a short axis along the first direction and a long axis along a second direction that crosses the first direction, and has a rectangular shape.

7. The display apparatus of claim 1, wherein the one of the first and second organic layers having the greater modulus comprises acryl and/or epoxy, and
   wherein another one of the first and second organic layers having a smaller modulus, comprises silicon and/or fluorine.

8. The display apparatus of claim 1, wherein the second modulus is smaller than the first modulus.

9. The display apparatus of claim 8, wherein the first organic layer comprises acryl and/or epoxy, and
   wherein the second organic layer comprises silicon and/or fluorine.

10. The display apparatus of claim 8, wherein the substrate comprises a bending area,
    wherein the first organic layer patterned to have the plurality of islands is positioned to correspond to the bending area, and
    wherein the organic layer comprises a material comprised in the first organic layer and is not patterned in areas other than the bending area of the substrate.

11. The display apparatus of claim 1, wherein the second modulus is greater than the first modulus.

12. The display apparatus of claim 11, wherein the substrate comprises a bending area,
    wherein the first organic layer patterned to have the plurality of islands is positioned to correspond to the bending area, and
    wherein the organic layer comprises a material comprised in the second organic layer and is not patterned in remaining areas other than the bending area of the substrate.

13. The display apparatus of claim 11, wherein the first organic layer comprises silicon and/or fluorine, and
    wherein the second organic layer comprises acryl and/or epoxy.

14. The display apparatus of claim 1, wherein the organic layer comprises a first portion having a first modulus, a second portion having a second modulus that is different from the first modulus, and a third portion having a third modulus that is between the first modulus and the second modulus.

15. The display apparatus of claim 1, wherein the organic layer comprises a first portion having a first modulus, a second portion having a second modulus that is different from the first modulus, and a third portion that is between the first portion and the second portion, wherein the third portion has a modulus that gradually increases or decreases from a location close to the first portion to a location close to the second portion.

* * * * *